US011710752B2

United States Patent
Liu et al.

(10) Patent No.: US 11,710,752 B2
(45) Date of Patent: Jul. 25, 2023

(54) FLICKER-MITIGATING PIXEL-ARRAY SUBSTRATE

(71) Applicant: OmniVision Technologies, Inc., Santa Clara, CA (US)

(72) Inventors: Yuanliang Liu, San Jose, CA (US); Bill Phan, San Jose, CA (US); Duli Mao, Sunnyvale, CA (US); Hui Zang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 165 days.

(21) Appl. No.: 17/118,252

(22) Filed: Dec. 10, 2020

(65) Prior Publication Data

US 2022/0190019 A1    Jun. 16, 2022

(51) Int. Cl.
*H01L 27/146* (2006.01)

(52) U.S. Cl.
CPC .... *H01L 27/14623* (2013.01); *H01L 27/1463* (2013.01); *H01L 27/14605* (2013.01); *H01L 27/14685* (2013.01); *H01L 27/14621* (2013.01); *H01L 27/14627* (2013.01)

(58) Field of Classification Search
CPC ........ H01L 27/14623; H01L 27/14605; H01L 27/1463; H01L 27/14685; H01L 27/14621; H01L 27/14627
See application file for complete search history.

(56) References Cited

U.S. PATENT DOCUMENTS

| | | | |
|---|---|---|---|
| 9,160,953 B2 | 10/2015 | Oishi | |
| 9,202,841 B1 | 12/2015 | Xing et al. | |
| 9,443,899 B1 | 9/2016 | Liu et al. | |
| 9,659,989 B1 | 5/2017 | Ai et al. | |
| 2016/0276394 A1 | 9/2016 | Chou et al. | |
| 2018/0033809 A1 | 2/2018 | Tayanaka et al. | |
| 2018/0091723 A1 | 3/2018 | Funaki | |
| 2018/0308883 A1* | 10/2018 | Yanagita | H01L 27/14645 |

(Continued)

OTHER PUBLICATIONS

U.S. Appl. No. 17/118,230 Non-Final Office Action dated Aug. 2, 2022, 17 pages.

(Continued)

*Primary Examiner* — Nelson Garces
(74) *Attorney, Agent, or Firm* — Cozen O'Connor (57) ABSTRACT

A flicker-mitigating pixel-array substrate includes a semiconductor substrate and a metal annulus. The semiconductor substrate includes a small-photodiode region. A back surface of the semiconductor substrate forms a trench surrounding the small-photodiode region in a cross-sectional plane parallel to a back-surface region of the back surface above the small-photodiode region. The metal annulus (i) at least partially fills the trench, (ii) surrounds the small-photodiode region in the cross-sectional plane, and (iii) extends above the back surface. A method for fabricating a flicker-mitigating pixel-array substrate includes forming a metal layer (i) in a trench that surrounds the small-photodiode region in a cross-sectional plane parallel to a back-surface region of the back surface above the small-photodiode region and (ii) on the back-surface region. The method also includes decreasing a thickness of an above-diode section of the metal layer located above the back-surface region.

24 Claims, 7 Drawing Sheets

(56) References Cited

U.S. PATENT DOCUMENTS

| | | | |
|---|---|---|---|
| 2019/0006408 A1* | 1/2019 | Fang | H01L 27/14685 |
| 2020/0043962 A1* | 2/2020 | Cho | H01L 27/14627 |
| 2020/0227467 A1* | 7/2020 | Yokogawa | H01L 27/14603 |
| 2021/0193727 A1* | 6/2021 | Asatsuma | H01L 27/14623 |
| 2021/0391361 A1* | 12/2021 | Huang | H01L 27/1463 |

OTHER PUBLICATIONS

U.S. Appl. No. 17/118,230 Final Office Action dated Nov. 28, 2022, 16 pages.

* cited by examiner

FLICKER-MITIGATING PIXEL-ARRAY SUBSTRATE

BACKGROUND

Cameras installed on a motor vehicle include an image sensor having a pixel array. The pixel array includes a first group of pixels configured for bright-light detection and a second group of pixels configured low-light detection. Images and video captured by such cameras often include flicker artifacts caused by daytime running lights of the motor vehicle. The light-generating elements of the daytime running lights are light-emitting diodes that flicker at rates of approximately one hundred hertz.

In addition to flicker artifacts, a second image artifact common to motor-vehicle camera is called petal flare. Each of the first and second groups of pixels is arranged in a two-dimensional periodic array with a pixel pitch that is between two and three times the wavelength of light incident thereon. Many image sensors include a microlens array, formed of a plurality of microlenses each aligned to a respective pixel, that has two-dimensionally periodic surface height above the pixel array. The periodicity of the image sensor's pixel array and microlens array thereon results in the image sensor resembling a reflective two-dimensional diffraction grating. Part of light incident on the image sensor is diffracted toward the camera's imaging lens. Different elements of the camera, e.g., a cover glass, an IR-cut filter, a surface of the imaging lens, reflect this diffracted light back toward the image sensor, which produces petal flare.

SUMMARY OF THE EMBODIMENTS

Embodiments disclosed herein mitigate flicker artifacts and petal flare by, for each pixel of the first group of pixels, integrating a metal film located above the pixel's photodiode with a metal that fills a trench surrounding the pixel.

In embodiments, each pixel includes a small photodiode and a large photodiode adjacent to the small photodiode. A metal layer is disposed covering a light exposure surface of the small photodiode. The metal layer attenuates incident light propagating toward the small photodiode, which prevents the small photodiode from reaching saturation during an integration operation, and hence mitigates flickering.

In a first aspect, a flicker-mitigating pixel-array substrate includes a semiconductor substrate and a metal annulus. The semiconductor substrate includes a small-photodiode region. A back surface of the semiconductor substrate forms a trench surrounding the small-photodiode region in a cross-sectional plane parallel to a back-surface region of the back surface above the small-photodiode region. The metal annulus (i) at least partially fills the trench, (ii) surrounds the small-photodiode region in the cross-sectional plane, and (iii) extends above the back surface.

In a second aspect, a method for fabricating a flicker-mitigating pixel-array substrate includes forming a metal layer (i) in a trench that surrounds a small-photodiode region of a semiconductor substrate in a cross-sectional plane parallel to a back-surface region of the back surface above the small-photodiode region and (ii) on the back-surface region. Part of the trench is between the small-photodiode region and an adjacent large photodiode region of the semiconductor substrate. The method also includes decreasing a thickness of an above-diode section of the metal layer located above the back-surface region.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed using semiconductors such as silicon, silicon-germanium, germanium, gallium arsenide, and combinations thereof. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meanings.

Figure 1:
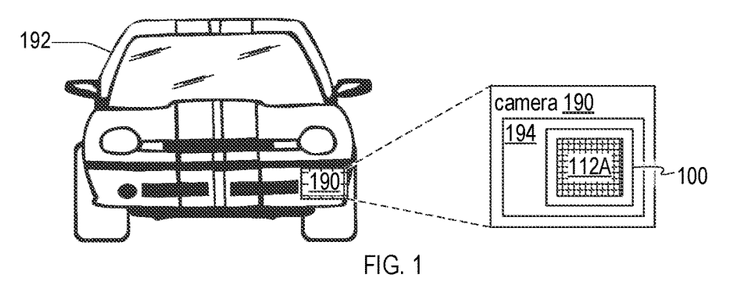
FIG. 1 is schematic of a vehicle, a camera mounted thereon that includes an image sensor.

FIG. 1 is a schematic of a camera 190 mounted on a vehicle 192. Camera 190 includes an image sensor 194, which includes a pixel-array substrate 100. Pixel-array substrate 100 includes a pixel-array 112A. Pixel array 112A includes a plurality of large photodiodes, forming a first photodiode array, and a plurality of small photodiodes forming a second photodiode array interspersed with the first photodiode array. The plurality of large photodiodes may be configured for lower intensity light sensing, and the plurality of small photodiodes may be configured for higher intensity light sensing to realize high dynamic range (HDR) sensing. A large photodiode may have a full well capacity that is greater than a full well capacity of a small photodiode. Pixel-array substrate 100 may part of a chip-scale package or a chip-on-board package.

Figure 2:
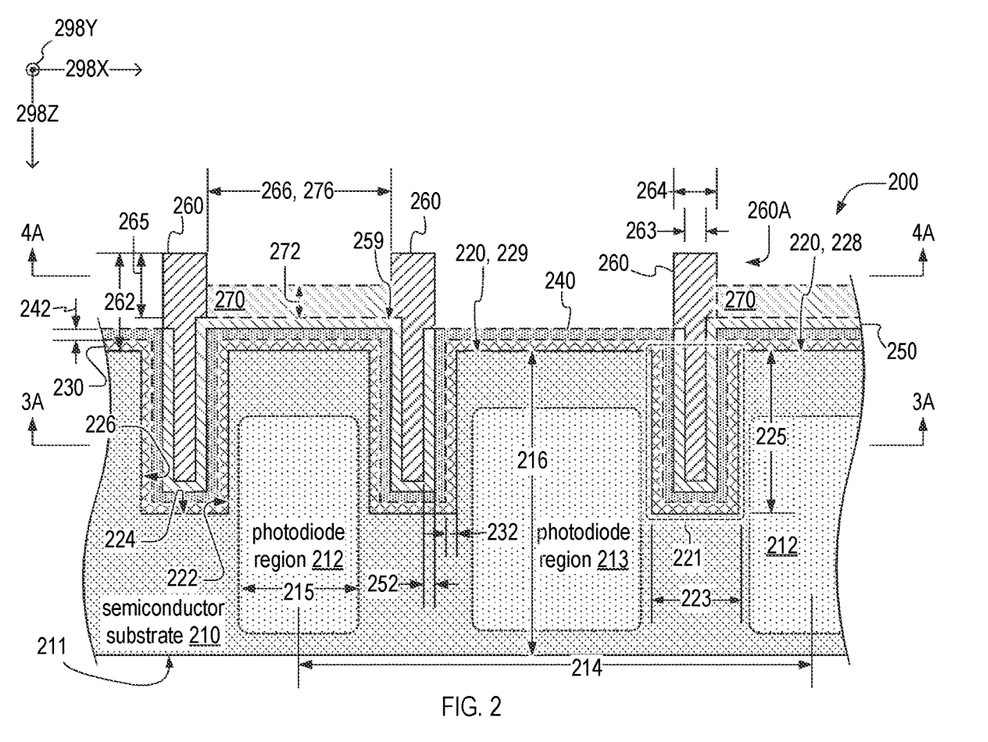
FIGS. 2 and 3 are respective schematics of a flicker-mitigating pixel-array substrate of the camera of FIG. 1, in an embodiment.
Figure 3:
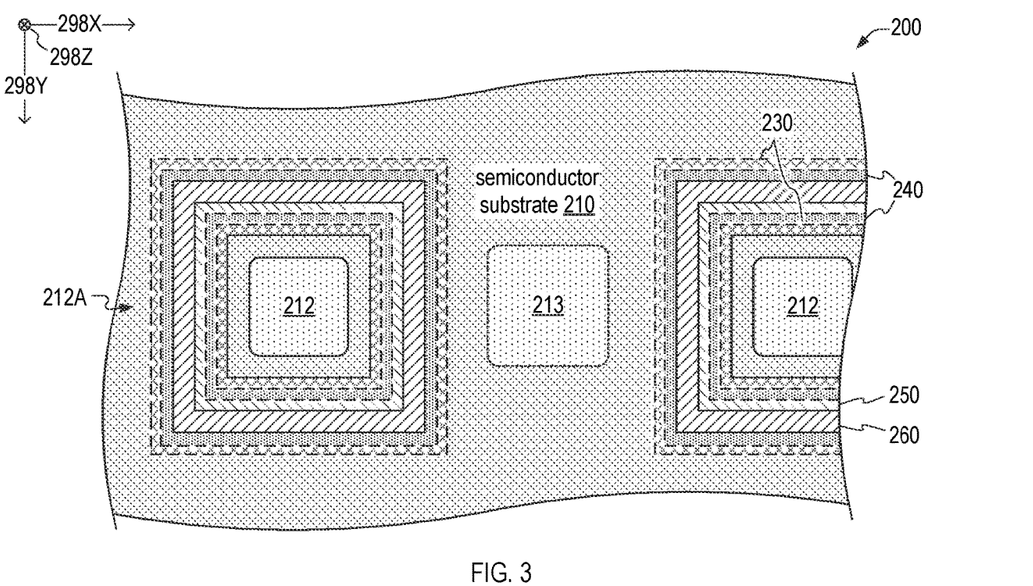

FIGS. 2 and 3 are respective cross-sectional schematics of a flicker-mitigating pixel-array substrate 200, hereinafter also pixel-array substrate 200. The cross-section illustrated in FIG. 2 is parallel to a plane, hereinafter the x-z plane, formed by orthogonal axes 298X and 298Z, which are each orthogonal to an axis 298Y. Herein, the x-y plane is formed by orthogonal axes 298X and 298Y, and planes parallel to the x-y plane are referred to as transverse planes. Unless otherwise specified, heights of objects herein refer to the object's extent along axis 298Z. Herein, a reference to an axis x, y, or z refers to axes 298X, 298Y, and 298Z respectively. Also, herein, a horizontal plane is parallel to the x-y plane, a width refers to an object's extent along the y axis, and vertical refers to a direction along the z axis. The cross-sectional view of FIG. 3 is in a cross-sectional plane 3A denoted in FIG. 2.

Pixel-array substrate 200 is an example of pixel-array substrate 100 of image sensor 194 and includes a semiconductor substrate 210 and a metal annulus 260 disposed on semiconductor substrate 210. In embodiments, metal annulus 260 is structured to surround a plurality of color filters, each color filter occupying a respective aperture formed by metal annulus 260.

In embodiments, pixel-array substrate 200 includes a plurality of interconnected metal annuluses 260 that form a metal grid 260A. In a horizontal plane, metal annulus 260 has an aperture, the shape of which may be polygonal (such as square, rectangular, or hexagonal), or circular.

Constituent elements of semiconductor substrate 210 may include at least one of silicon and germanium. Semiconductor substrate 210 includes a front surface 211, a back surface 220, and a small-photodiode region 212. Back surface 220 includes in inner-sidewall surface-region 222, an outer-sidewall surface-region 226, and a bottom surface-region 224 that forms a trench 221. FIG. 2 denotes a surface-region 228 and 229 of back surface 220 above small-photodiode regions 212 and large photodiode regions 213, respectively. In cross-sectional plane 3A, parallel to back-surface region 228, trench 221 surrounds small-photodiode region 212. In embodiments, pixel-array substrate 200 includes at least one of a passivation layer 230, an etch-stop layer 240, and an adhesion layer 250. In embodiments, pixel-array substrate includes a plurality of small-photodiode regions 212, each surrounded by respective interconnected metal segments of metal annulus 260. In embodiments, the metal annulus 260 defines a plurality of apertures above small-photodiode regions 212 and large photodiode regions 213 for confining the incident light within the respective small-photodiode regions 212 and large photodiode regions 213 through the back surface 220, by absorption and reflection, thus reduce optical crosstalk between adjacent photodiode regions 212, 213. The plurality of small-photodiode regions 212 and the plurality of large-photodiode regions 213 are photodiode regions of a pixel array 212A, which is an example of pixel array 112A, FIG. 1.

In embodiments, semiconductor substrate 210 includes a plurality of large-photodiode regions 213, one of which is shown in each of FIGS. 2 and 3. Each photodiode region 213 is between a respective pair of adjacent small photodiode regions 212. The plurality of large-photodiode regions 213 forms a two-dimensional array. In embodiments, each large-photodiode region 213 is part of a respective pixel of a large-pixel array formed in semiconductor substrate 210, where the large-pixel array is interleaved with the small-pixel array that includes the two-dimensional array of photodiode regions 212. In embodiments, trench 221 is a trench for forming deep trench isolation structure providing isolation between each small photodiode region 212 and adjacent large photodiodes 213.

Semiconductor substrate 210 has a thickness 216 between front surface 211 and back surface-region 228. Trench 221 has a width 223 and a depth 225 in the horizontal and vertical directions respectively with respect to back surface-region 228. Width 223 may be between 0.10 micrometers and 0.25 micrometers. Depth 225 is with respect to back surface-region 228, and may be between 0.5 micrometers and 2.0 micrometers. Depth 225 also may be configured based on a thickness of semiconductor substrate 210. In embodiments, thickness 216 exceeds depth 225 by between 0.5 micrometers and 2.0 micrometers to ensure sufficient electrical isolation. In embodiments, depth 225 equals thickness 216 such that trench 221 extends through semiconductor substrate 210.

Metal annulus 260 at least partially fills trench 221, surrounds small-photodiode region 212 in cross-sectional plane 3A, defines an aperture above small-photodiode region 212, and extends above back surface-region 228 by a height 262. In embodiments, height 262 is between 0.1 micrometers and 0.8 micrometers. When pixel-array substrate 100 includes adhesion layer 250, metal annulus 260 has a height 265 with respect to a top surface 259 of adhesion layer 250. In embodiments, height 265 is between 0.1 micrometers and 0.3 micrometers. Beneath back surface 220 (within trench 221), metal annulus 260 has a width 263. Above back surface 220, metal annulus 260 has a width 264, which may exceed width 263. In embodiments, metal annulus 260 is aligned with trench 221 such that a center of the aperture formed by metal annulus 260 is aligned with photodiode region 212 in at least one of the horizontal direction and the vertical direction. In embodiments, the aperture formed by metal annulus 260 above back surface 220 is laterally shifted from photodiode region 212.

In embodiments, materials constituting metal annulus 260 include at least one of tungsten and aluminum. Tungsten is absorptive at visible and near-IR wavelengths, and hence reduces petal flare artifacts by absorbing diffracted light incident thereon.

In embodiments, pixel-array substrate 200 includes at least one metal layer 270 covering back-surface region 228.

Each metal layer 270 may be disposed above and aligned with a respective small photodiode region 212. Metal layer 270 can function to attenuate incident light directed thereto. Metal layer 270 may block a portion of incident light directed onto small photodiode regions 212 by the respective microlenses such that the small photodiode region 212 is not saturated by the high intensity light during an integration period of image sensor as only a portion of the high intensity light will penetrate through the respective metal layer 270. Thus, the sensitivity of the small photodiode regions 212 to high intensity light may be improved and flickering issue may be mitigated.

Each metal layer 270 may be at least one of (a) integrally formed with the metal annulus 260 surrounding it, and (b) be formed of the same material as metal annulus 260. In embodiments, metal layer 270 and the metal annulus 260 surrounding it are structurally-connected to completely cover a light exposure area of small photodiode region 212 to attenuate the incident light directed to the small photodiode region 212 by reflection and/or absorption. Metal layer 270 has a thickness 272, which in embodiments is between ten nanometers and two hundred nanometers. In an embodiment, to ensure that metal layer 270 does not prevent too much light at a visible electromagnetic wavelength from reaching small-photodiode region 212, thickness 272 is less than a penetration depth, at the visible electromagnetic wavelength, of a material forming the metal layer 270. In embodiments, thickness 272 of the metal layer 270 is less than height 265 of adjacent metal annulus 260. Metal annulus 260 and metal layer 270 have an inner width 266 and a width 276, respectively. In embodiments at least one of (i) inner width 266 is equal to a width 276, and (ii) the shape of metal layer 270 is congruent with the shape of the aperture formed by metal annulus 260 above small-photodiode region 212, such that metal layer 270 fills the aperture formed by metal annulus 260 in horizontal planes that intersect metal layer 270.

In embodiments, metal annulus 260 surrounds the light exposure area of the plurality of large and small photodiode regions 212, 213. Metal annulus 260 reduces cross-talk by at least partially filling trench 221 and extending above semiconductor substrate 210. Metal layer 270 reduces flicker artifacts. Whereas conventional pixel-array substrates employ separate structures to address cross-talk and flicker artifacts, embodiments of pixel-array substrate 200 include one monolithic structure—metal annulus 260 and metal layer 270—that performs both functions, thereby simplifying fabrication processes associated with forming pixel-array substrate 200.

Adhesion layer 250 covers surface-region 228 and extends into trench 221 between (i) metal layer 270 and inner-sidewall surface-region 222 and between (ii) metal layer 270 and outer-sidewall surface-region 226. In embodiments, materials forming adhesion layer 250 include at least one of titanium and titanium nitride. In embodiments, adhesion layer 250 is one of a single layer or multi-layer stack (e.g., stack of titanium and titanium nitride layers).

Adhesion layer 250 has a thickness 252, which may be in a vertical and/or a horizontal direction. In embodiments, thickness 252 is between ten nanometers and two hundred nanometers, for example, when pixel-array substrate 200 lacks metal layer 270 such that adhesion layer 250 also functions as an attenuation layer. In embodiments, thickness 252 is between twenty nanometers and fifty nanometers, for example, when pixel-array substrate 200 includes metal layer 270 and adhesion layer 250 is between metal layer 270 and semiconductor substrate 210. In such embodiments, the minimum thickness needs to be sufficiently thick, e.g., greater than ten nanometers allowable when metal layer 270 is not present, to prevent diffusion of metal from metal layer 270 through adhesion layer 250. Adhesion layer 250 may also function as a bather layer preventing metal ions diffusion from metal layer 270 into semiconductor substrate 210.

Passivation layer 230 covers back-surface region 228 and is located between metal annulus 260 and semiconductor substrate 210. In embodiments, passivation layer 230 adjoins back surface 220. In embodiments, an additional liner layer is between passivation layer 230 and semiconductor substrate 210. The additional liner layer may be thinner than passivation layer 230, and may be formed of an oxide material. In embodiments, one or more anti-reflection layers may be formed between passivation layer 230 and back surface 220, and may be formed of a material such as hafnium oxide ($HfO_2$) and/or tantalum oxide ($TA_2O_5$).

Passivation layer 230 may conformally cover surface-regions 222, 224, and 226 of trench 221. Passivation layer 230 may be formed of a high-κ material, e.g., a material having a dielectric constant K greater than or equal that of silicon nitride (κ≥7). In embodiments, example materials forming passivation layer 230 include aluminum oxide ($Al_2O_3$), hafnium oxide ($HfO_2$), and combinations thereof. Passivation layer 230 has a thickness 232 which, in embodiments, is between a minimum thickness of ten angstroms and a maximum thickness of fifty nanometers. When thickness 232 is less than the minimum thickness, passivation layer 230 no longer functions as an effective passivation layer. When thickness 232 exceeds the maximum thickness, the excess thickness does not improve functioning of passivation layer 230, and hence needlessly increases the overall thickness of pixel-array substrate 200.

Etch-stop layer 240 is between metal annulus 260 and passivation layer 230. In embodiments, etch-stop layer 240 is formed of an oxide material or an oxynitride material. Etch-stop layer 240 has a thickness 242 which, in embodiments, is between fifty nanometers and three hundred nanometers.

In embodiments, semiconductor substrate 210 includes a two-dimensional array of small photodiode regions 212, where respective directions of rows and columns of the two-dimensional array define respective directions of axes 298Y and 298X. Adjacent small photodiode regions 212 are separated by a pixel-pitch 214 in each of the x and y directions. In embodiments, each small photodiode region 212 is part of a respective pixel of a small-pixel array formed in semiconductor substrate 210.

Figure 4:
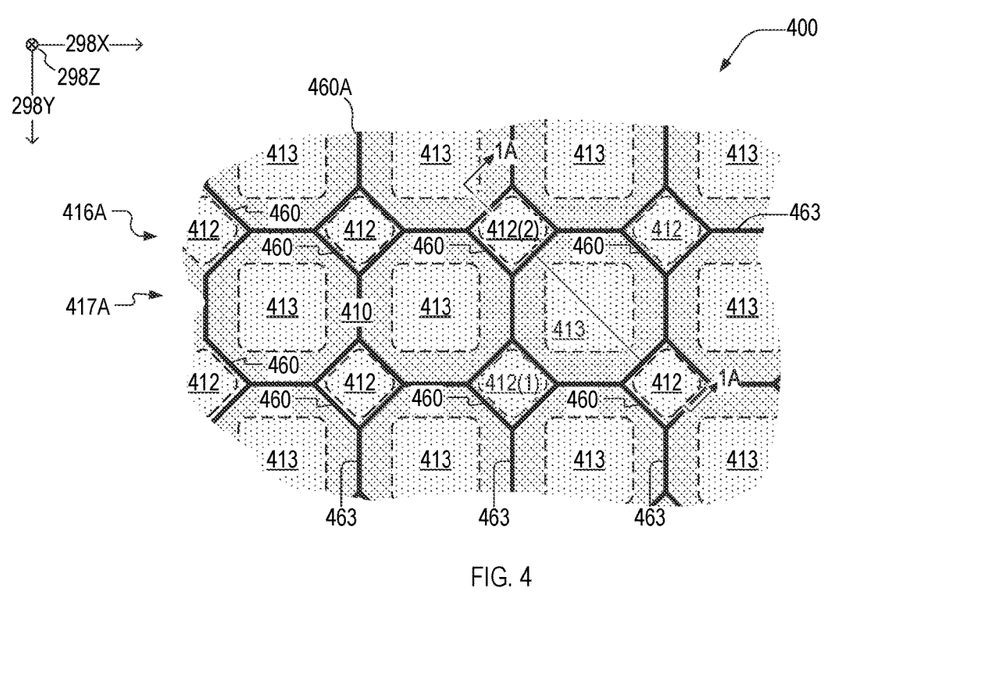
FIG. 4 is a cross-sectional schematic of a pixel-array substrate, which is an embodiment of the pixel-array substrate of FIG. 2.

FIG. 4 is a cross-sectional schematic of a pixel-array substrate 400, which is an example of pixel-array substrate 200. The cross-sectional view of FIG. 4 is in a cross-sectional plane 4A shown in FIG. 2. FIG. 4 denotes a cross-section 1A, which is an example of the cross-sectional plane of FIG. 1.

Pixel-array substrate 400 includes a plurality of small-photodiode regions 412 and a plurality of large-photodiode regions 413 which are respective examples of small-photodiode regions 212 and a plurality of large-photodiode regions 213. Each small-photodiode region 412 is located at a center of a respective two-by-two array of large-photodiode regions 413. Expressed differently, each small-photodiode region 412 is surrounded by four large-photodiode regions 413. For example, small-photodiode region 412(1) is located at a center of a two-by-two array of large-photodiode regions 413(1-4) and small-photodiode region 412(2) is located at a center of a two-by-two array of large-photodiode regions 413(3-6).

In embodiments, each small-photodiode region 412 is part of a respective pixel of a small-pixel array 416A formed in a semiconductor substrate 410 and each large-photodiode region 413 is part of a respective pixel of a large-pixel array 417A formed in semiconductor substrate 410. Pixel-array substrate 400 is an example of pixel-array substrate 100, such that, in embodiments, pixel-array 112A includes both small-pixel array 416A and large-pixel array 417A. Semiconductor substrate 410 is an example of semiconductor substrate 210.

In embodiments, pixel-array substrate 400 includes a metal grid 460A formed of a plurality of metal annuluses 460 and a plurality of interconnecting segments 463 that connect adjacent annuluses 460. Metal grid 460A is an example of metal grid 260A. Metal annulus 460 is an example of metal annulus 260. In embodiments, metal annuluses 460 and interconnecting segments 463 are integrally formed such that metal grid 460A is monolithic. In embodiments, each interconnecting segment 463 extends into a respective trench that surrounds a large-photodiode region 413. For clarity of illustration, not all interconnecting segments 463 are labeled in FIG. 4. While photodiode regions 412 and 413 are not in cross-sectional plane 4A, FIG. 4 illustrates them for sake of illustrating the alignment of metal grid 460A to photodiode regions 412 and 413.

Figure 5:
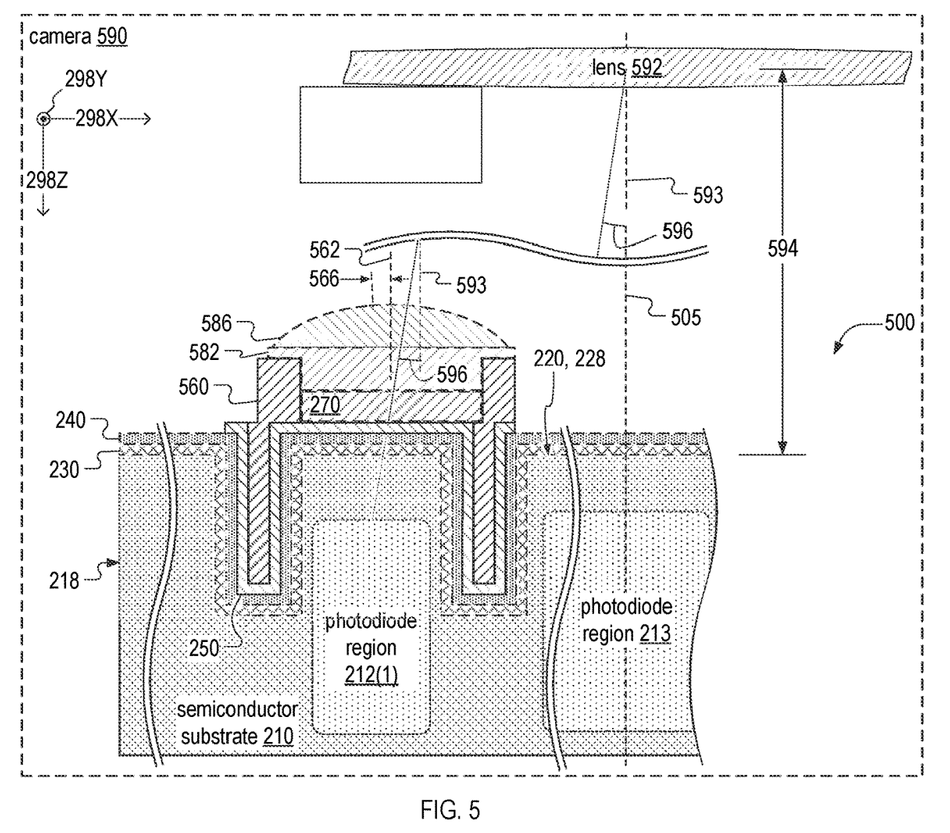
FIG. 5 is a cross-sectional schematic of a pixel-array substrate, which is an embodiment of a pixel-array substrate of FIG. 2.

FIG. 5 is a cross-sectional schematic of a pixel-array substrate 500, which is an example of a pixel-array substrate 200. Pixel-array substrate 500 includes semiconductor substrate 210 and at least one of layers 230, 240, and 250. Pixel-array substrate 500 includes a small photodiode region 212(1) that is between an edge surface 218 of semiconductor substrate 210 and a center plane 505 of pixel-array substrate 500. Center plane 505 is parallel to the y-z plane. In embodiments, center plane 505 is positioned such that an equal number of photodiode regions 212 are on each side of center plane 505. That is, center plane 505 intersects a center of pixel array 212A.

In embodiments, pixel-array substrate is part of a camera 590, which is an example of camera 190. Camera 590 includes an imaging lens 592 located at a distance 594 above back surface 220 of semiconductor substrate 210. In embodiments, distance 594 is between a principal plane of lens 592 and back surface 220. Imaging lens has an optical axis 593. Imaging lens 592 is aligned to pixel-array substrate 500 such that an optical axis of the imaging lens is in center plane 505.

Pixel-array substrate 500 also includes a metal annulus 560, which is an example of metal annulus 260. In embodiments, pixel-array substrate includes a plurality of interconnected metal annuluses 560 that form a metal grid, which is an example of metal grid 260A. Pixel-array substrate 500 may also include metal layer 270 within metal annulus 560. In embodiments, metal layer 270 is structurally connected to or monolithically formed with, metal annulus 560. Metal annulus 560 forms an aperture above adhesion layer 250. In direction 298X, the aperture has a center in a plane 562, which is laterally offset by an offset distance 566 from a center of photodiode region 212(1). The size of offset distance 566 depends on the location of photodiode region 212(1) in with respect to the center plane 505 e.g., in a direction away from the center of pixel array 212A toward edge surface 218. Offset distance 566 may be a function of an angle 596 between a center of photodiode region 212(1) and center plane 505 to achieve a desired light sensitivity or quantum efficiency for each pixel. In embodiments, $d_{566} = d_{594} \tan \theta_{596}$, where $d_{566}$, $d_{594}$, and $\theta_{596}$ are offset distance 566, distance 594, and angle 596 respectively.

Offset distance 566 may equal zero, when angle 596 is zero or close to zero, such as less than five degrees. FIG. 2 illustrate an example of a center-located pixel where the center of the aperture formed by metal annulus 260 has zero offset distance with respect to the center of respect photodiode region 212. In embodiments, pixel-array substrate includes a color filter 582 and a microlens 586 each aligned with metal annulus 560. Color filter 582 (e.g., red color filter, green color filter or blue color filter) is disposed on the metal layer 270 and into the aperture defined by metal annulus 560 above photodiode region 212. Microlens 586 is disposed on color filter 582 and metal annulus 560. In embodiments, small photodiode region 212 and adjacent large photodiode region 213 are formed under the same color filter.

Figure 6:
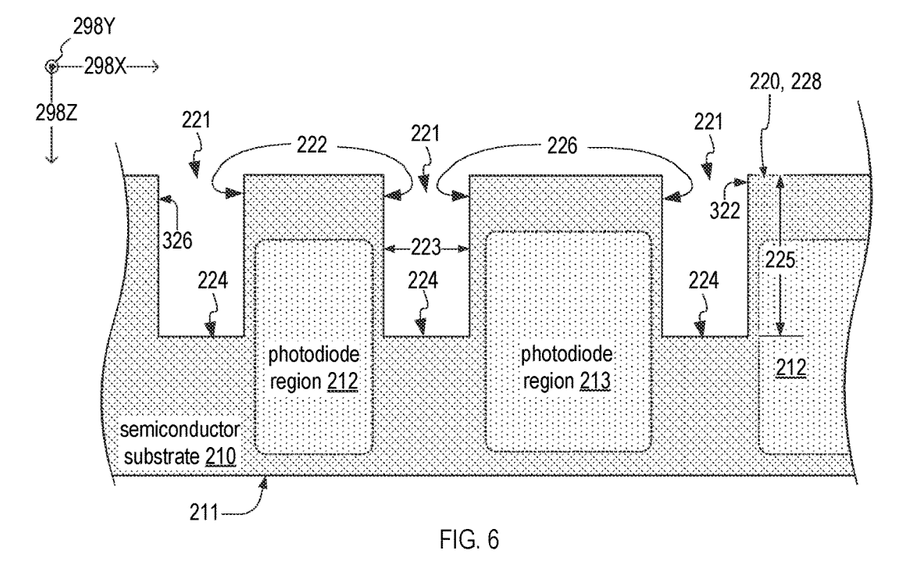
FIG. 6 is a cross-sectional schematic of the semiconductor substrate of the flicker-mitigating pixel-array substrate of FIG. 2, in an embodiment.
Figure 7:
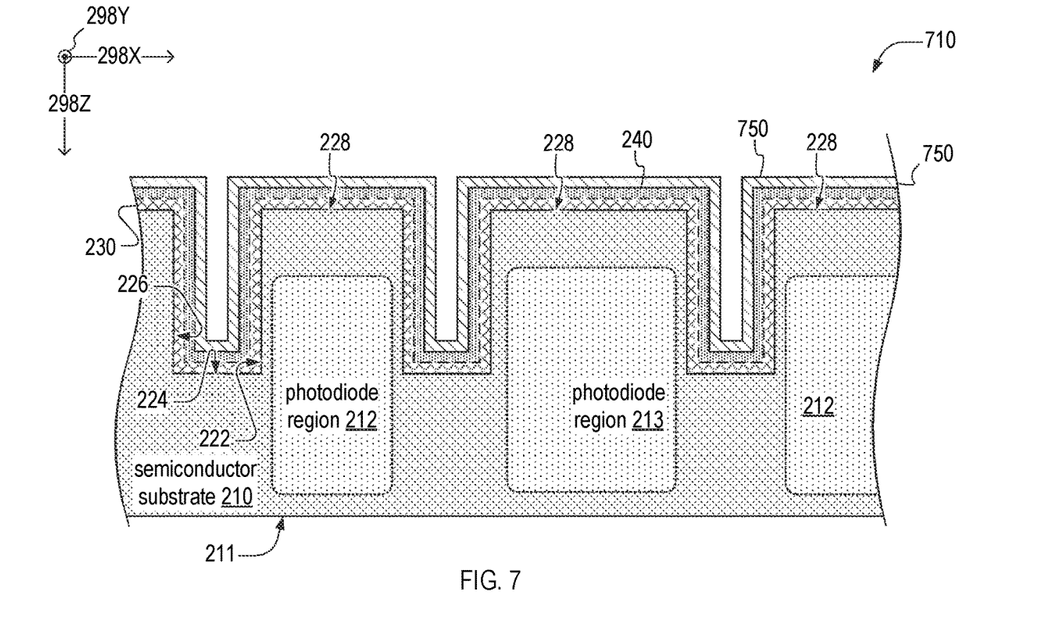
FIG. 7 is a cross-sectional schematic of the semiconductor substrate of FIG. 6 with a passivation layer, an etch-stop layer, and an adhesion layer thereon, in an embodiment.

FIG. 6 is a cross-sectional schematic of semiconductor substrate 210 with trenches 221 therein formed by surface-regions 222, 224, and 226. FIG. 7 is a cross-sectional schematic of a coated substrate 710, which is semiconductor substrate 210 with passivation layer 230, etch-stop layer 240, and an adhesion layer 750 thereon. Adhesion layer 750 is an example of adhesion layer 250 that is above both photodiode regions 212 and 213. In embodiments, coated substrate 710 lacks at least one of passivation layer 230, etch-stop layer 240, and adhesion layer 750.

Figure 8:
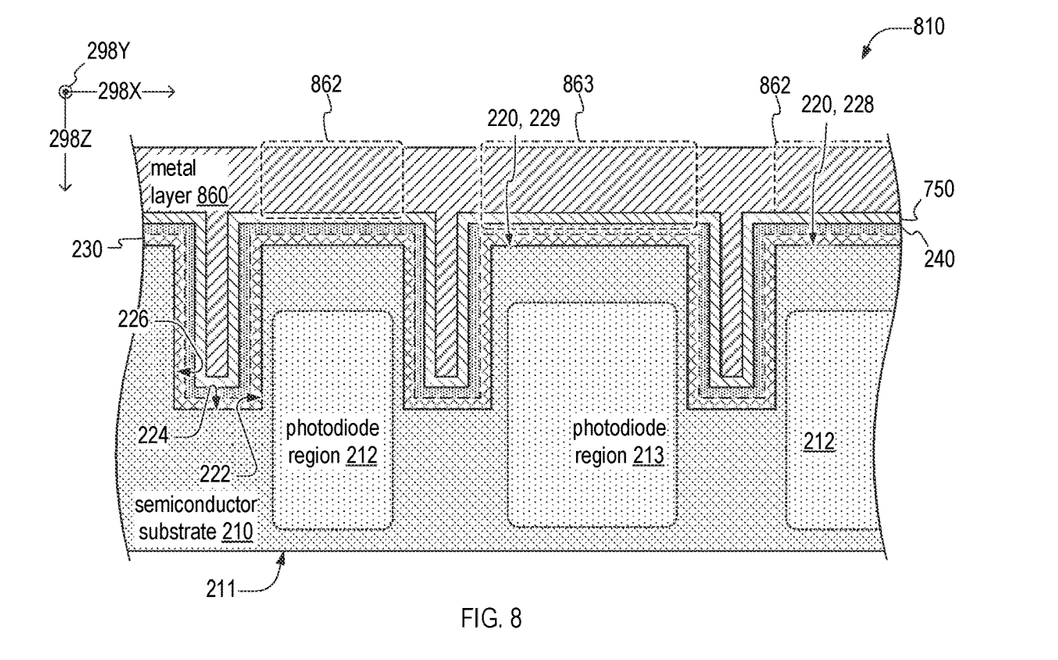
FIG. 8 is a cross-sectional schematic of the coated substrate of FIG. 7 with a metal layer thereon, in an embodiment.

FIG. 8 is a cross-sectional schematic of a coated substrate 810, which is coated substrate 710 with a metal layer 860 thereon that at least partially fills trenches 221 and is on back-surface regions 228. FIG. 8 denotes a plurality of above-diode sections 862, each of which includes parts of metal layer 860 and adhesion layer 750 located above a small photodiode region 212 and, in embodiments, parts of at least one of layers 230 and 240 on surface region 222. FIG. 8 also denotes one of a plurality of above-diode sections 863, each of which includes parts of metal layer 860 and adhesion layer 750 located above a photodiode region 213 and, in embodiments, parts of at least one of layers 230, 240 on surface region 222. Each of above-diode sections 862 may be optically aligned with each respective photodiode region 212. Each of above-diode sections 863 may be optically aligned with each respective photodiode region 213.

Figure 9:
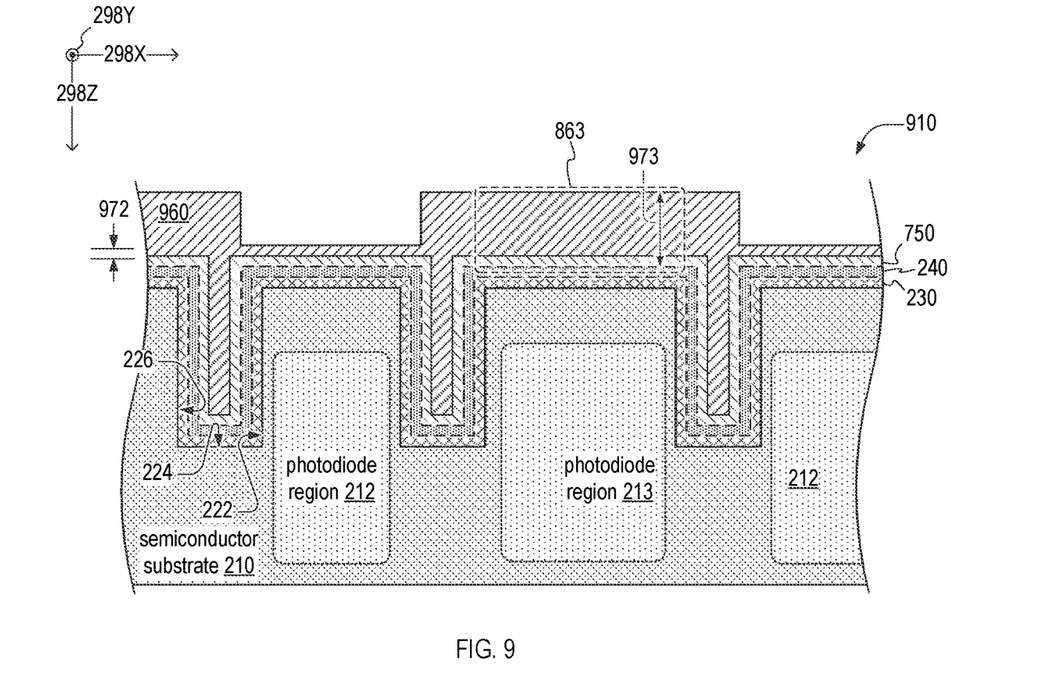
FIGS. 9 and 10 are each a cross-sectional schematic of the coated substrate of FIG. 8 after removal of part of the metal layer of FIG. 8, in an embodiment.

FIG. 9 is a cross-sectional schematic of a coated substrate 910, which is coated substrate 810 after removal of at least part of each above-diode section 862 from metal layer 860, for example by a mask and etching process, to a yield metal layer 960. Metal layer 960 has a thickness 972 above each photodiode region 212. In embodiments, thickness 972 equals zero. Metal layer 960 has a thickness 973 above each photodiode region 213 and, in embodiments, above trenches 221. In embodiments, thickness 973 exceeds thickness 972.

Figure 10:
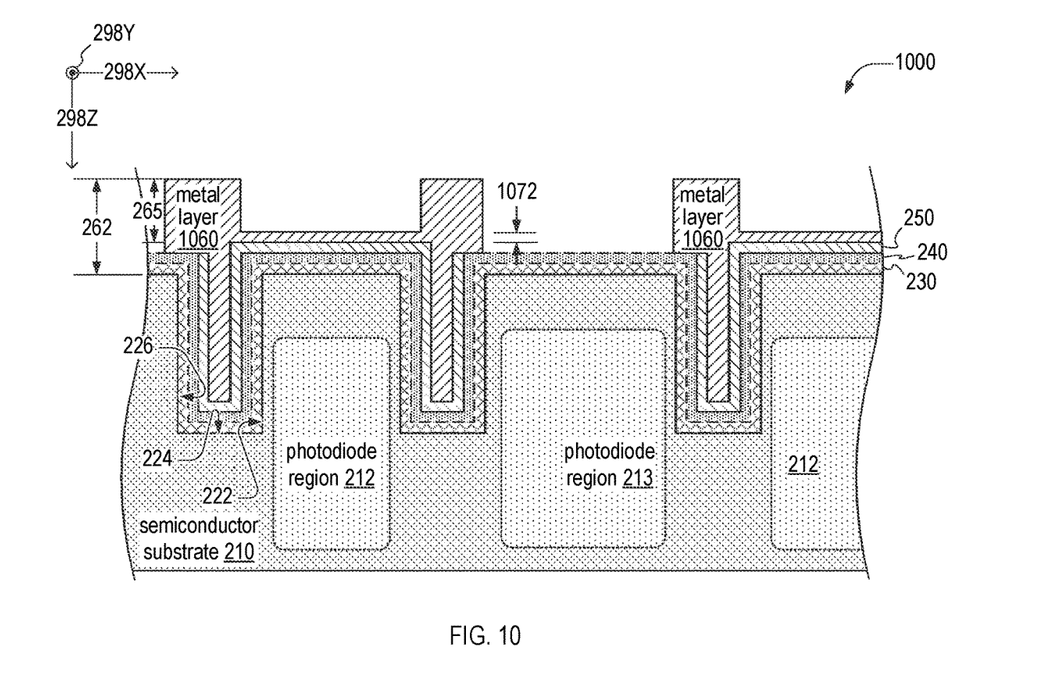

FIG. 10 is a cross-sectional schematic of a pixel-array substrate 1000, which is coated substrate 710 after removal of each above-diode section 863 from metal layer 960 and adhesion layer 750 to yield adhesion layer 250 and a metal layer 1060. Pixel-array substrate 1000 is an example of pixel-array substrate 200. Metal layer 1060 has heights 262, 265 of metal annulus 260, and a thickness 1072 of metal layer 270, FIG. 2. When thickness 1072 equals zero, pixel-array substrate 1000 lacks a metal layer, such as metal layer 270, and metal layer 1060 is an example of metal annulus 260. When thickness 1072 is greater than zero, thickness 1072 is an example of thickness 272, and metal layer 1060 is an example of metal annulus 260 integrally formed with metal layer 270 for attenuating incident light propagating to small photodiode regions 212.

Figure 11:
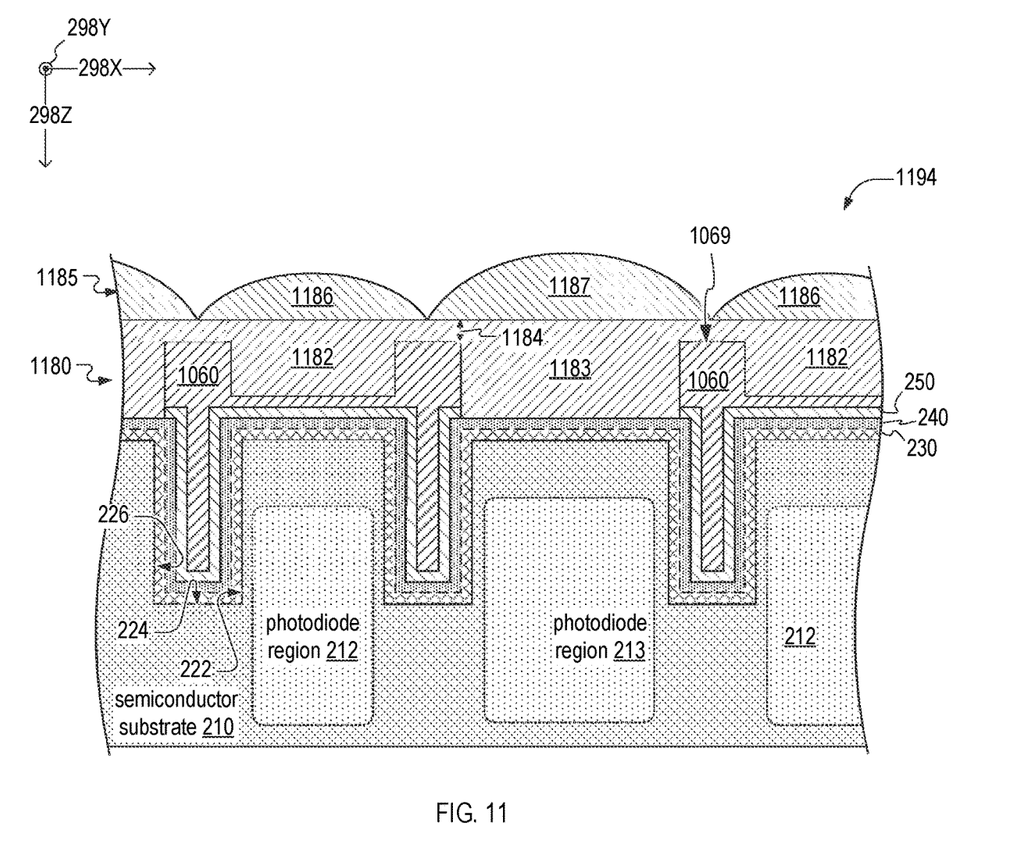
FIG. 11 is a cross-sectional schematic of an image sensor, which is an embodiment of the image sensor of FIG. 1.

FIG. 11 is a cross-sectional schematic of an image sensor 1194, which is an example of image sensor 194 of camera 190, FIG. 1. Image sensor 1194 includes pixel-array substrate 200, a color filter array 1180, and a microlens array 1185. Microlens array 1185 is disposed on color filter array 1180. Microlens array 1185 includes (i) a plurality of microlenses 1186 each aligned to a respective photodiode region 212 for directing incident light thereto, and (ii) a plurality of microlenses 1187 each aligned to a respective photodiode region 213 for directing light thereto. In embodiments, a microlens (1186, 1187) qualifies as being aligned to a photodiode region (213, 214) when at least part of the microlens is directly above the photodiode region.

In embodiments, each of microlenses 1186 and 1187 is formed above the metal grid formed from metal layer 1060 and has an optical axis aligned with the center of at least one of a respective aperture defined by metal grid and a photodiode region 212 or 213. In embodiments, microlens 1187 is thicker than microlens 1186. Color filter array 1180 is between microlens array 1185 and back surface 220 and includes a plurality of color filters 1182 and 1183. Each color filter 1182 is aligned to respective photodiode region 212 for spectrally filtering light transmitted through a microlens 1186 aligned thereto. Each color filter 1183 is aligned to respective photodiode region 213 for spectrally filtering light transmitted through a respective microlens 1187 aligned thereto. In embodiments, the plurality of color filters 1182 and 1183 are arranged according to Bayer pattern.

In embodiments, color filter array 1180 is formed on metal layer 1060 and metal layer 1060 is embedded within color filter array 1180. Color filter 1183 is between the two adjacent metal layers 1060. In embodiments, the plurality of color filters 1182 and 1183 is surrounded by the metal grid formed of metal layers 1060. The plurality of color filters 1182 and 1183 are disposed in the respective apertures defined by metal grid above the photodiode regions 212, 213.

In embodiments, a first height of microlens 1186 has i.e., a distance between the top of microlens 1186 and the respective color filter 1182 is different from a second height of microlens 1187, i.e., the distance between the top of microlens 1187 and the respective color filter 1183. For example, the first height of microlens 1186 may be less than the second height of microlens 1187, i.e., microlens 1187 is taller than the microlens 1186, to compensate curvature differences between microlens 1186 and microlens 1187, such that microlens 1186 and microlens 1187 have substantially the same focal length.

Metal layer 1060 has a top surface 1069. In embodiments, color filter array 1180 extends to a distance 1184 above top surface 1069 such that adjacent color filters 1182 and 1183 adjoin above a metal layer 1060. In embodiments, distance 1184 equals zero such that adjacent color filters 1182 and 1183 do not adjoin above a metal layer 1060 and parts of microlens array 1185 are directly disposed on top surface 1069.

Figure 12:
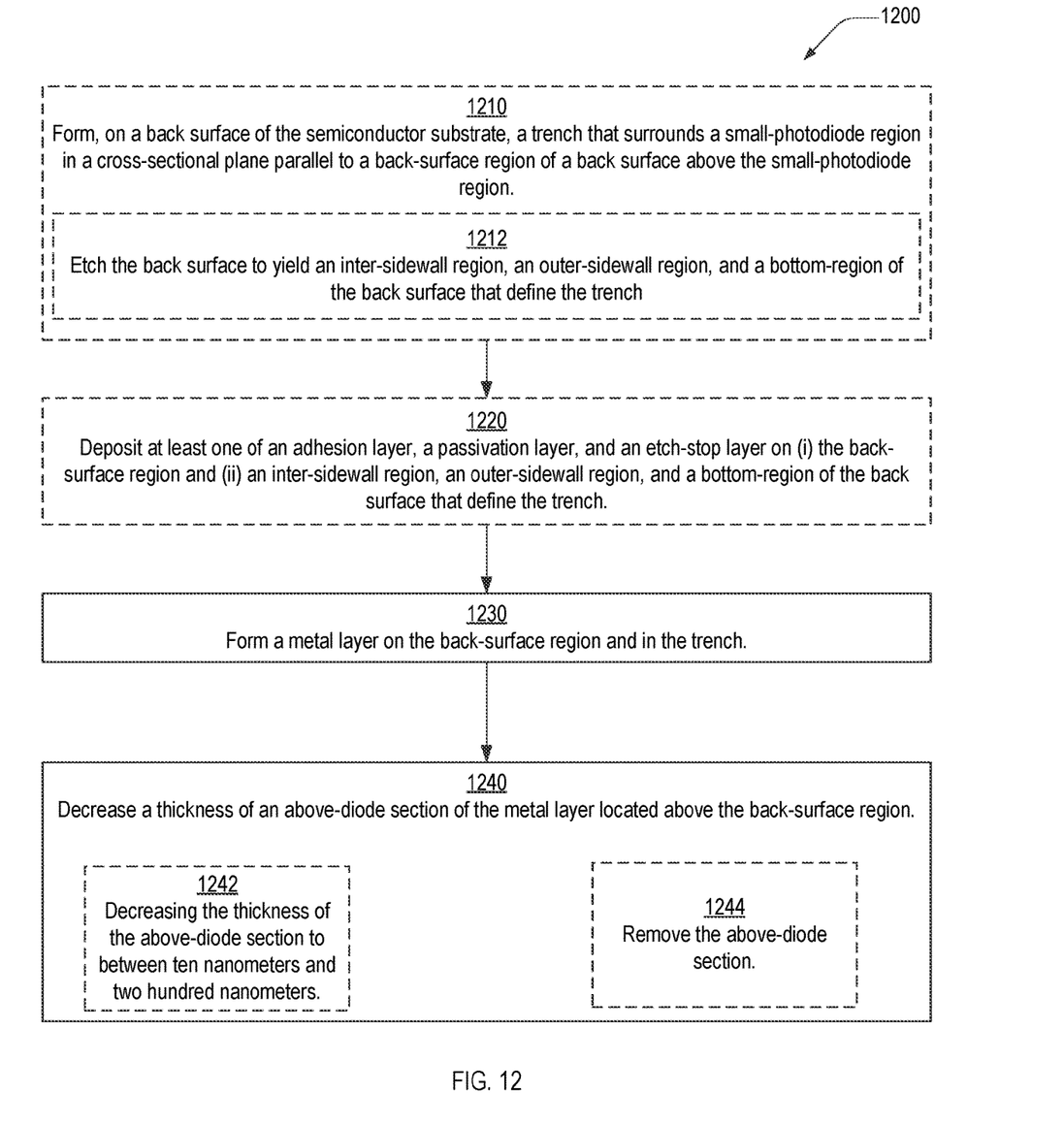
FIG. 12 is a flowchart illustrating a method for fabricating a flicker-mitigating pixel-array substrate, in an embodiment.

FIG. 12 is a flowchart illustrating a method 1200 for fabricating a flicker-mitigating pixel-array substrate. Method 1200 includes steps 1230 and 1240. In embodiments, method 1200 includes at least one of steps 1210, 1220, and 1230. Steps of method 1200 refer to singular elements of flicker-mitigating pixel-array substrates disclosed herein, such as a trench, a photodiode region, a back-surface region, a metal layer. It is understood that any of steps of method 1200 apply to more than one of these elements simultaneously, such as multiple trenches, photodiode regions, back-surface regions, and metal layers of a flicker-mitigating pixel-array substrate.

Step 1210 includes forming, on a back surface of the semiconductor substrate, a trench that surrounds the small-photodiode region in a cross-sectional plane parallel to a back-surface region of the back surface above the small-photodiode region. Part of the trench is located between the small-photodiode region and an adjacent large photodiode region of the semiconductor substrate. In an example of step 1210, at least one trench 221 is formed on back surface 220 of semiconductor substrate 210, FIG. 2 surrounding at least one small-photodiode region 212. Step 1210 may also include forming, on the back surface, a trench that surrounds a large-photodiode region, such as large-photodiode region 213. In embodiments, the trench formed surrounding a small-photodiode region and the trench surrounding a large-photodiode region adjacent to the small-photodiode region are interconnected.

In embodiments, step 1210 includes a step 1212, which includes etching the back surface to yield an inner-sidewall region, an outer-sidewall region, and a bottom-region of the back surface that define the trench. In an example of step 1212, back surface 220 of semiconductor substrate 210 is etched to yield inner-sidewall surface-region 222, outer-sidewall surface-region 226, and bottom surface-region 224 of back surface 220 that define at least one trench 221.

Step 1220 includes depositing at least one of an adhesion layer, a passivation layer, and an etch-stop layer on (i) the back-surface region and (ii) an inner-sidewall region, an outer-sidewall region, and a bottom-region of the back surface that define the trench. In an example of step 1220 at least one of passivation layer 230, an etch-stop layer 240, and an adhesion layer 250 is deposited on back surface 220. In an example of 1220, deposition of adhesion layer 250 follows deposition of etch-stop layer 240, which follows deposition of passivation layer 230.

Step 1230 includes forming a metal layer on the back-surface region and in the trench. In an example of step 1230, metal layer 860, FIG. 8, is formed on the adhesion layer 250 formed on the back-surface regions 228 and 229 and in trenches 221.

Step 1240 includes decreasing a thickness of an above-diode section of the metal layer located above the back-surface region. In an example of step 1240, a thickness of above-diode sections 862 of metal layer 860 is decreased to yield metal layer 960, FIG. 9. In embodiments, step 1240 includes one of steps 1242 and 1244.

Step 1242 includes decreasing the thickness of the above-diode section to between ten nanometers and two hundred nanometers. In an example of step 1242, the thickness of above-diode sections 862 is decreased such that thickness 972 of metal layer 960 is between ten nanometers and two hundred nanometers.

Step 1244 includes removing the above-diode section. In embodiments, step 1244 includes removing the above-diode section via a process that includes at least one of applying a patterned mask and (ii) etching. In a first example of step 1244, above-diode sections 862 of metal layer 860 are etched and removed such that thickness 972 of metal layer 960 is zero. When coated substrate 810 includes adhesion layer 250, step 1244 may include removing above-diode sections 862 while leaving at least part of adhesion layer 250 intact. In embodiments, step 1244 further includes etching and removing above-diode sections 863 of metal layer 860 and adhesion layer 250 located above large photodiode region 213 such that the adhesion layer 250 and metal layer 860 does not affect light sensitivity of large photodiode region 213. Step 1244 may be executed using a patterned mask.

Combinations of Features

Features described above, as well as those claimed below, may be combined in various ways without departing from the scope hereof. The following enumerated examples illustrate some possible, non-limiting combinations.

(A1) A flicker-mitigating pixel-array substrate includes a semiconductor substrate and a metal annulus. The semiconductor substrate includes a small-photodiode region. A back surface of the semiconductor substrate forms a trench surrounding the small-photodiode region in a cross-sectional plane parallel to a back-surface region of the back surface above the small-photodiode region. The metal annulus (i) at least partially fills the trench, (ii) surrounds the small-photodiode region in the cross-sectional plane, and (iii) extends above the back surface.

(A2) Embodiments of pixel-array substrate (A1) further include a metal layer covering the back-surface region and integrally formed with the metal annulus, which surrounds the back-surface region.

(A3) In embodiments of pixel-array substrate (A2), a thickness of the metal layer is between ten nanometers and two hundred nanometers.

(A4) In embodiments of any one of pixel-array substrates (A1)-(A3), the metal annulus extends above the back surface by at least seventy-five nanometers.

(A5) In embodiments of pixel-array substrate (A4), the metal annulus extends above the back surface by at most 0.8 micrometers.

(A6) Embodiments of any one of pixel-array substrates (A1)-(A5) further include an adhesion layer covering the back-surface region and extending into the trench between the metal annulus and an inner-sidewall region of the back surface and an outer-sidewall region of the back surface.

(A7) In embodiments of pixel-array substrate (A6), materials forming the adhesion layer include at least one of titanium and titanium nitride.

(A8) In embodiments of either one of pixel-array substrates (A6) and (A7), a thickness of the adhesion layer above the back-surface region is between twenty nanometers and fifty nanometers.

(A9) In embodiments of any one of pixel-array substrates (A1)-(A8), the semiconductor substrate further includes four large-photodiode regions forming a two-by-two array, the small-photodiode region being located at a center of the two-by-two array.

(A10) In embodiments of pixel-array substrates (A10), the four large-photodiode regions include a first, a second, a third, and a fourth large-photodiode region. The semiconductor substrate further includes a (i) fifth large-photodiode region and a sixth large-photodiode region that, with the third and fourth large-photodiode regions, form an additional two-by-two array, and (ii) an additional small-photodiode region located at a center of the additional two-by-two array.

(A11) Embodiments of either of pixel-array substrates (A9) and (A10) further include a passivation layer on the back-surface region and the back surface above each of the four large-photodiode regions.

(A12) Embodiments of any of pixel-array substrates (A9)-(A11) further include an etch-stop layer in the trench between the metal annulus and the passivation layer.

(A13) In embodiments of any one of pixel-array substrates (A1)-(A12), materials forming the metal annulus including at least one tungsten and aluminum.

(A14) In embodiments of any one of pixel-array substrates (A2)-(A13), the metal layer and the metal annulus are structurally connected to cover a light exposure area associated with the small-photodiode region to attenuate an incident light directed to the small-photodiode region.

(A15) Embodiments of any one of pixel-array substrates (A2)-(A14) further include a color filter surrounded by the metal annulus and disposed on both the metal annulus and the metal layer.

(A16) In embodiments of any one of pixel-array substrates (A5)-(A15), the metal annulus forms an aperture above the small-photodiode region. A center of the aperture is laterally offset from a center of the small-photodiode region (B1) A method for fabricating a flicker-mitigating pixel-array substrate includes forming a metal layer (i) in a trench that surrounds a small-photodiode region of a semiconductor substrate in a cross-sectional plane parallel to a back-surface region of the back surface above the small-photodiode region and (ii) on the back-surface region. Part of the trench is between the small-photodiode region and an adjacent large photodiode region of the semiconductor substrate. The method also includes decreasing a thickness of an above-diode section of the metal layer located above the back-surface region.

(B2) In embodiments of method (B1), decreasing the thickness includes decreasing the thickness of the above-diode section to between ten nanometers and two hundred nanometers.

(B3) In embodiments of either one of methods (B1) and (B2), decreasing the thickness comprising removing the above-diode section.

(B4) Embodiments of any one of methods (B1)-(B3) may further include, before forming the metal layer, depositing an adhesion layer on (i) the back-surface region and (ii) an inter-sidewall region, an outer-sidewall region, and a bottom-region of the back surface that define the trench.

(B5) In embodiments of method (B4), decreasing the thickness includes removing the above-diode section while leaving the adhesion layer intact on the back-surface region (B6) Embodiments of any one of methods (B1)-(B5) may further include, before forming the metal layer, depositing a passivation layer on (i) the back-surface region and (ii) an inter-sidewall region, an outer-sidewall region, and a bottom-region of the back surface that define the trench.

(B7) Embodiments of method (B6) further include, before depositing the metal layer, depositing an etch-stop layer on the passivation layer.

(B8) Embodiments of any one of methods (B1)-(B7) may further include, after forming the metal layer, depositing a color filter material above the back-surface region to yield a color filter optically aligned with the small-photodiode region and surrounded by the metal layer.

(B9) In embodiments of method (B8) include forming a microlens on the color filter.

(B10) In embodiments of any one of methods (B1)-(B9), decreasing the thickness includes removing an additional above-diode section of the metal layer located above the adjacent large-photodiode region.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A flicker-mitigating pixel-array substrate comprising:
   a semiconductor substrate including four large-photodiode regions forming a two-by-two array, and a small-photodiode region located at a center of the two-by-two array, a back surface of the semiconductor substrate forming a trench surrounding the small-photodiode region in a cross-sectional plane parallel to a small back-surface region of the back surface above the small-photodiode region;
   a metal annulus at least partially filling the trench, surrounding the small-photodiode region in the cross-sectional plane, extending above the back surface;
   a monolithic metal structure including (i) a metal annulus at least partially filling the trench, surrounding the small-photodiode region in the cross-sectional plane and the small back-surface region, extending above the back surface, and (ii) a metal layer covering the small back-surface region; and
   a color filter surrounded by the metal annulus and disposed on both the metal annulus and the metal layer.

2. The pixel-array substrate of claim 1, wherein the metal layer and the metal annulus are structurally connected to cover a light exposure area associated with the small-photodiode region to attenuate an incident light directed to the small-photodiode region.

3. The pixel-array substrate of claim 1, a thickness of the metal layer being between ten nanometers and two hundred nanometers.

4. The pixel-array substrate of claim 1, the metal annulus extending above the back surface by at least seventy-five nanometers and at most 0.8 micrometers.

5. The pixel-array substrate of claim 4, the metal annulus forming an aperture above the small-photodiode region, a center of the aperture being laterally offset from a center of the small-photodiode region.

6. The pixel-array substrate of claim 1, further comprising an adhesion layer covering the small back-surface region and extending into the trench between the metal annulus and an inner-sidewall region of the back surface and an outer-sidewall region of the back surface.

7. The pixel-array substrate of claim 6, materials forming the adhesion layer including at least one of titanium and titanium nitride.

8. The pixel-array substrate of claim 6, a thickness of the adhesion layer above the small back-surface region being between twenty nanometers and fifty nanometers.

9. The pixel-array substrate of claim 1, the four large-photodiode regions including a first, a second, a third, and a fourth large-photodiode region, the semiconductor substrate further including a (i) fifth large-photodiode region and a sixth large-photodiode region that, with the third and fourth large-photodiode regions, form an additional two-by-two array, and (ii) an additional small-photodiode region located at a center of the additional two-by-two array.

10. The pixel-array substrate of claim 1, further comprising a passivation layer on the small back-surface region and the back surface above each of the four large-photodiode regions.

11. The pixel-array substrate of claim 10, further comprising an etch-stop layer in the trench between the metal annulus and the passivation layer.

12. The pixel-array substrate of claim 1, materials forming the metal annulus including at least one tungsten and aluminum.

13. A method for fabricating the flicker-mitigating pixel-array substrate of claim 1, comprising:
   forming a metal layer (i) in a trench that surrounds a small-photodiode region of a semiconductor substrate in a cross-sectional plane parallel to a back-surface region of the back surface above the small-photodiode region and (ii) on the back-surface region, part of the trench being between the small-photodiode region and an adjacent large-photodiode region of the semiconductor substrate; and
   decreasing a thickness of an above-diode section of the metal layer located above the back-surface region.

14. The method of claim 13, decreasing the thickness comprising decreasing the thickness of the above-diode section to between ten nanometers and two hundred nanometers.

15. The method of claim 13, decreasing the thickness comprising removing the above-diode section.

16. The method of claim 13, further comprising, before forming the metal layer, depositing an adhesion layer on (i) the back-surface region and (ii) an inter-sidewall region, an outer-sidewall region, and a bottom-region of the back surface that define the trench.

17. The method of claim 16, decreasing the thickness comprising removing the above-diode section while leaving the adhesion layer intact on the back-surface region.

18. The method of claim 13, further comprising, before forming the metal layer, depositing a passivation layer on (i) the back-surface region and (ii) an inter-sidewall region, an outer-sidewall region, and a bottom-region of the back surface that define the trench.

19. The method of claim 18, further comprising, before depositing the metal layer, depositing an etch-stop layer on the passivation layer.

20. The method of claim 13, further comprising, after forming the metal layer, depositing a color filter material above the back-surface region to yield a color filter optically aligned with the small-photodiode region and surrounded by the metal layer.

21. The method of claim 20, further comprising forming a microlens on the color filter.

22. The method of claim 13, decreasing the thickness comprising removing an additional above-diode section of the metal layer located above the adjacent large-photodiode region.

23. A flicker-mitigating pixel-array substrate comprising:
   a semiconductor substrate including four large-photodiode regions forming a two-by-two array, and a small-photodiode region located at a center of the two-by-two array, a back surface of the semiconductor substrate forming a trench surrounding the small-photodiode region in a cross-sectional plane parallel to a small back-surface region of the back surface above the small-photodiode region;
   a metal annulus at least partially filling the trench, surrounding the small-photodiode region in the cross-sectional plane, extending above the back surface;
   a monolithic metal structure including (i) a metal annulus at least partially filling the trench, surrounding the small-photodiode region in the cross-sectional plane and the small back-surface region, extending above the back surface, and (ii) a metal layer covering the small back-surface region; and
   an adhesion layer covering the small back-surface region and extending into the trench between the metal annulus and an inner-sidewall region of the back surface and an outer-sidewall region of the back surface, the adhesion layer not covering any of four large back-surface regions of the back surface above a respective one of the four large-photodiode regions.

24. The pixel-array substrate of claim 1, the monolithic metal structure not including a metal layer covering any of four large back-surface regions of the back surface above a respective one of the four large-photodiode regions.

\* \* \* \* \*